(12) United States Patent
Lee et al.

(10) Patent No.: US 9,377,659 B2
(45) Date of Patent: Jun. 28, 2016

(54) DISPLAY DEVICE AND MANUFACTURING METHOD THEREOF

(71) Applicant: Samsung Display Co., Ltd., Yongin, Gyeonggi-Do (KR)

(72) Inventors: Dae Ho Lee, Seoul (KR); Yong Seok Kim, Seoul (KR); Sung Hwan Won, Suwon-si (KR); Han Joon Yoo, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/291,923

(22) Filed: May 30, 2014

(65) Prior Publication Data

US 2015/0185567 A1  Jul. 2, 2015

(30) Foreign Application Priority Data

Dec. 30, 2013 (KR) .................. 10-2013-0167563

(51) Int. Cl.
| G02F 1/1333 | (2006.01) |
|---|---|
| G02F 1/1362 | (2006.01) |
| G02F 1/1334 | (2006.01) |
| G02F 1/1368 | (2006.01) |
| H01L 21/02 | (2006.01) |
| H01L 21/56 | (2006.01) |
| H01L 27/12 | (2006.01) |
| H01L 29/786 | (2006.01) |
| C09K 19/54 | (2006.01) |

(52) U.S. Cl.
CPC ........ *G02F 1/136209* (2013.01); *G02F 1/1334* (2013.01); *G02F 1/1368* (2013.01); *G02F 1/133377* (2013.01); *H01L 21/0217* (2013.01); *H01L 21/02164* (2013.01); *H01L 21/56* (2013.01); *H01L 27/124* (2013.01); *H01L 27/1248* (2013.01); *H01L 27/1259* (2013.01); *H01L 29/78633* (2013.01); *C09K 19/544* (2013.01); *G02F 1/136227* (2013.01); *G02F 2001/136222* (2013.01)

(58) Field of Classification Search
CPC ............................ G02F 1/1334; C09K 19/544
See application file for complete search history.

(56) References Cited

U.S. PATENT DOCUMENTS

| 2003/0202267 A1 | 10/2003 | Yamasaki et al. |
|---|---|---|
| 2013/0321734 A1 | 12/2013 | Won et al. |

FOREIGN PATENT DOCUMENTS

| KR | 10-2003-0076421 A | 9/2003 |
|---|---|---|
| KR | 1020120091796 | 8/2012 |
| KR | 10-2013-0019570 | 2/2013 |
| KR | 10-2013-0107952 | 10/2013 |
| KR | 10-2013-0121545 | 11/2013 |
| KR | 1020130134153 A | 12/2013 |
| KR | 10-2014-0025739 | 3/2014 |

OTHER PUBLICATIONS

EP Search Report corresponding to European Patent Application No. 14176507.3, May 22, 2015, 8 pages.

*Primary Examiner* — Phu Vu
(74) *Attorney, Agent, or Firm* — Innovation Counsel LLP

(57) ABSTRACT

The inventive concept relates to a display device preventing from generating a reflection light at a portion region of a thin film transistor and a manufacturing method thereof, and a display device according to an exemplary embodiment of the inventive concept includes: a substrate; a thin film transistor; a pixel electrode; a light blocking member formed on the pixel electrode to overlap the thin film transistor, the light blocking member being formed on an opposite side of the thin film transistor with respect to the pixel electrode, a common electrode formed on the pixel electrode to be spaced apart from the pixel electrode with a plurality of microcavities interposed therebetween; a roof layer formed on the common electrode; an injection hole exposing a portion of each microcavity; a liquid crystal layer filling the microcavity; and an encapsulation layer formed on the roof layer.

20 Claims, 20 Drawing Sheets

230R  230G  230B
230

DISPLAY DEVICE AND MANUFACTURING METHOD THEREOF

This application claims priority to and the benefit of Korean Patent Application No. 10-2013-0167563 filed in the Korean Intellectual Property Office on Dec. 30, 2013, the entire contents of which are incorporated herein by reference.

BACKGROUND (a) Technical Field

The inventive concept relates to a display device and a manufacturing method thereof. More particularly, the inventive concept relates to a display device in which generation of reflected light at a portion of a thin film transistor is prevented, and a manufacturing method thereof.

(b) Description of the Related Art

Liquid crystal displays are one of the most widely used flat panel displays. Liquid crystal displays include two substrates on which electric field generating electrodes, such as pixel electrodes and a common electrode, are formed, and a liquid crystal layer disposed between the substrates. Liquid crystal displays apply a voltage to the electric field generating electrodes to generate an electric field on the liquid crystal layer, alter an arrangement of liquid crystal molecules of the liquid crystal layer, and control the polarization of input light to display an image.

The two display substrates forming the liquid crystal display may be a thin film transistor array substrates and an opposing display substrates. In the thin film transistor array substrates, a gate line transmitting a gate signal and a data line transmitting a data signal are formed to be crossed, and a thin film transistor connected to the gate line and the data line and a pixel electrode connected to the thin film transistor may be formed. The opposing display substrates may include a light blocking member, a color filter, a common electrode, etc. If necessary, the light blocking member, the color filter, and the common electrode may be formed in the thin film transistor array substrates.

However, in a liquid crystal display in the related art, two substrates are necessarily used, and respective constituent elements are formed on the two substrates, and as a result, there are problems in that the display device is heavy and thick, has a high cost, and has a long processing time.

The above information disclosed in this Background section is only for enhancement of understanding of the background of the inventive concept and therefore it may contain information that does not form the prior art.

SUMMARY

The inventive concept has been made in an effort to provide a display device and a manufacturing method thereof having advantages of reducing weight, thickness, cost, and processing time when manufacturing the display device using one substrate.

The inventive concept provides a display device in which generation of reflected light at a portion of a thin film transistor is prevented, and a manufacturing method thereof.

A display device according to an exemplary embodiment of the inventive concept includes: a substrate; a thin film transistor formed on the substrate; a pixel electrode connected to the thin film transistor; a light blocking member formed on the pixel electrode to overlap the thin film transistor, the light blocking member being formed on an opposite side of the thin film transistor with respect to the pixel electrode; a common electrode formed on the pixel electrode to be spaced apart from the pixel electrode with a plurality of microcavities interposed therebetween; a roof layer formed on the common electrode; an injection hole exposing a portion of each microcavity; a liquid crystal layer filling the microcavity; and an encapsulation layer formed on the roof layer so as to cover the injection hole to seal the microcavity.

A light blocking member protection layer formed on the light blocking member may be further included.

The light blocking member protection layer may include a silicon nitride or a silicon oxide.

The color filter may include a first color filter and a second color filter, and the first color filter and the second color filter may overlap each other at the second valley.

A manufacturing method of a display device according to an exemplary embodiment of the inventive concept includes: forming a thin film transistor on a substrate; forming a pixel electrode connected to the thin film transistor; forming a light blocking member on the pixel electrode to overlap the thin film transistor, the light blocking member being formed on an opposite side of the thin film transistor with respect to the pixel electrode; forming a sacrificial layer on the pixel electrode; forming a common electrode on the sacrificial layer; forming a roof layer on the common electrode; patterning the common electrode and the roof layer to expose a portion of the sacrificial layer; removing the sacrificial layer to form a microcavity between the pixel electrode and the common electrode; injecting a liquid crystal material inside the microcavity to form a liquid crystal layer; and forming an encapsulation layer so as to cover a portion where the microcavity is exposed to seal the microcavity.

The method may further include forming a light blocking member protection layer on the light blocking member.

The light blocking member protection layer may include a silicon nitride or a silicon oxide.

The color filter may include a first color filter and a second color filter, and the first color filter and the second color filter may overlap each other at the second valley.

The light blocking member may directly contact the pixel electrode.

The light blocking member may partially overlap the gate line and the storage electrode.

The display device and the manufacturing method according to an exemplary embodiment of the inventive concept have the following effects.

The manufacturing method of the display device according to an exemplary embodiment of the inventive concept manufactures the display device by using one substrate, thereby reducing weight, thickness, cost, and process time thereof.

Also, by forming the light blocking member after forming the pixel electrode, a reflection light may be prevented at a contact portion of the thin film transistor and the pixel electrode.

DETAILED DESCRIPTION OF THE EMBODIMENTS

Figure 1:
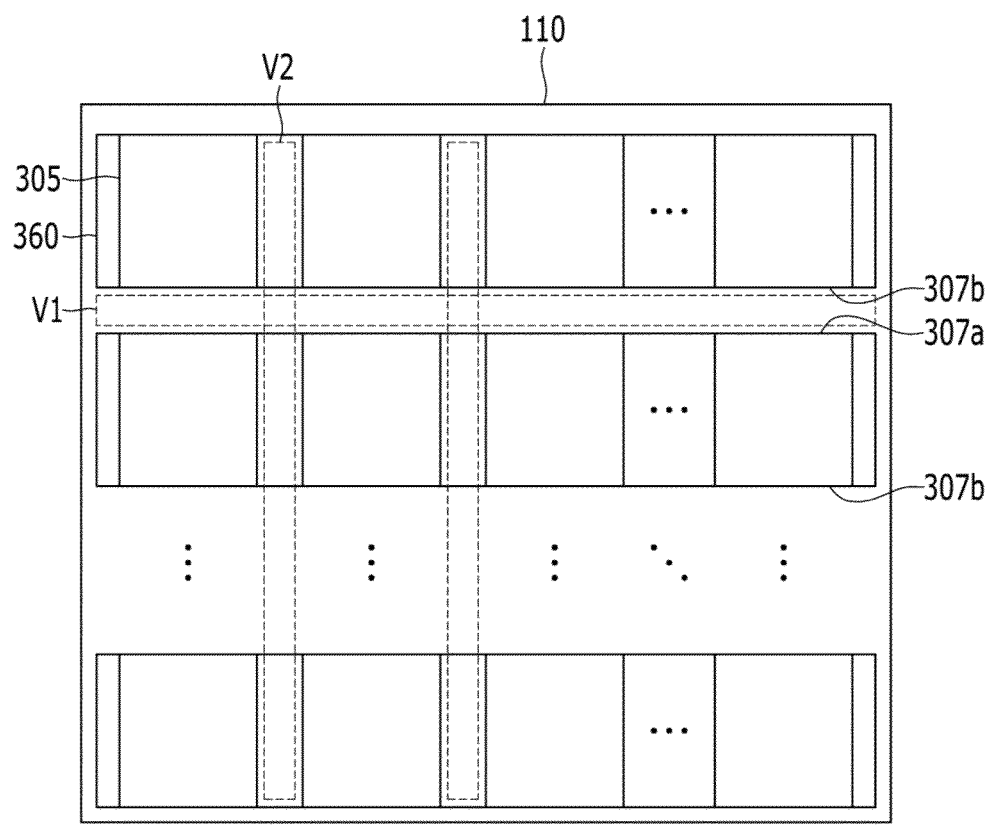
FIG. 1 is a top plan view of a display device according to an exemplary embodiment of the inventive concept.

The inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be formed directly on the other element or formed with intervening elements. In contrast, when an element is referred to as being "directly on" another element, there are no intervening elements present.

First, a display device according to an exemplary embodiment of the inventive concept will be schematically described below with reference to FIG. 1.

FIG. 1 is a top plan view illustrating a display device according to an exemplary embodiment of the inventive concept.

A display device according to the exemplary embodiment of the inventive concept includes a substrate 110 made of a material such as glass or plastic.

Microcavities 305 covered by roof layers 360 are formed on the substrate 110. The roof layer 360 extends in a row direction, and the plurality of microcavities 305 are formed under one roof layer 360.

The microcavities 305 may be arranged in a matrix form, and a first valley V1 is disposed between the microcavities 305 adjacent to each other in a row direction, and a second valley V2 is disposed between the microcavities 305 adjacent to each other in a column direction.

The plurality of roof layers 360 may be separated from each other by the first valley V1 interposed therebetween. The microcavities 305 may not be covered by the roof layer 360 and may be exposed to the outside at portions in which the first valley V1 is disposed. They are referred to as injection holes 307a and 307b.

The injection holes 307a and 307b are formed at both edges of the microcavity 305. The injection holes 307a and 307b include a first injection hole 307a and a second injection hole 307b, and the first injection hole 307a is formed so as to expose a lateral surface of a first edge of the microcavity 305, and the second injection hole 307b is formed so as to expose a lateral surface of a second edge of the microcavity 305. The lateral surface of the first edge and the lateral surface of the second edge of the microcavity 305 face each other.

Each roof layer 360 is formed to be spaced apart from the substrate 110 between the adjacent second valleys V2 to form the microcavity 305. That is, the roof layer 360 is formed so as to cover the remaining lateral surfaces, except for the lateral surfaces of the first edge and the second edge in which the injection holes 307a and 307b are formed.

The aforementioned structure of the display device according to the exemplary embodiment of the inventive concept is just an example, and various modifications are feasible. For example, an arrangement form of the microcavity 305, the first valley V1, and the second valley V2 may be changed, the plurality of roof layers 360 may be connected to each other in the first valley V1, and a portion of each roof layer 360 may be formed to be spaced apart from the substrate 110 in the second valley V2 to connect the adjacent microcavities 305 to each other.

Hereinafter, one pixel of the display device according to the exemplary embodiment of the inventive concept will be schematically described with reference to FIG. 2.

Figure 2:
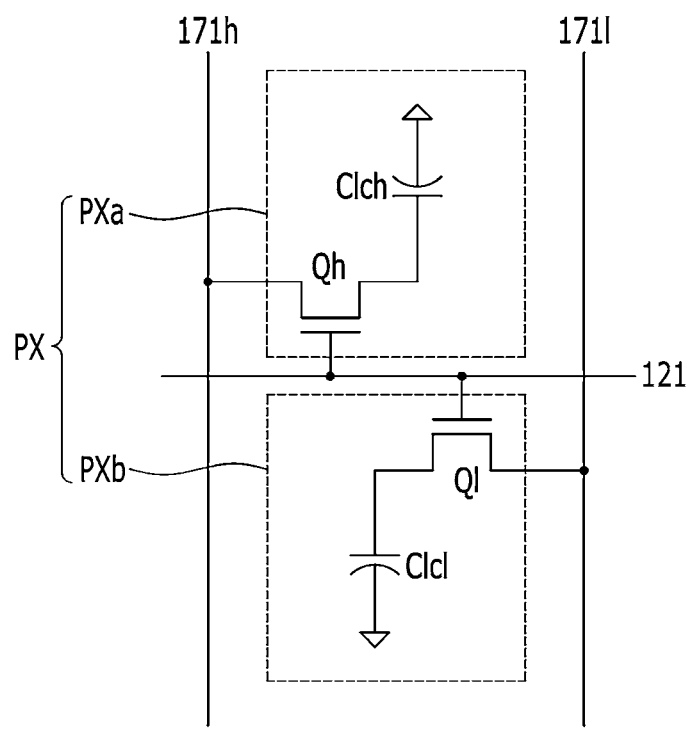
FIG. 2 is an equivalent circuit diagram of one pixel of a display device according to an exemplary embodiment of the inventive concept.

FIG. 2 is an equivalent circuit diagram of one pixel of the display device according to the exemplary embodiment of the inventive concept.

The display device according to the exemplary embodiment of the inventive concept includes a plurality of signal lines 121, 171h, and 171l, and a plurality of pixels PXs connected to the plurality of signal lines 121, 171h, and 171l. Although not shown, the plurality of pixels PXs may be arranged in a matrix form including a plurality of pixel rows and a plurality of pixel columns.

Each pixel PX may include a first subpixel PXa and a second subpixel PXb. The first subpixel PXa and the second subpixel PXb may be vertically disposed. In this case, the first valley V1 may be disposed in a direction of a pixel row between the first subpixel PXa and the second subpixel PXb, and the second valley V2 may be disposed between the plurality of pixel columns.

The signal lines 121, 171h, and 171l include a gate line 121 for transmitting a gate signal, and a first data line 171h and a second data line 171l for transmitting different data voltages.

The display device according to the exemplary embodiment of the inventive concept includes a first switching element Qh connected to the gate line 121 and the first data line 171h, and a second switching element Ql connected to the gate line 121 and the second data line 171l.

A first liquid crystal capacitor Clch connected to the first switching element Qh is formed in the first subpixel PXa, and a second liquid crystal capacitor Clcl connected to the second switching element Ql is formed in the second subpixel PXb.

A first terminal of the first switching element Qh is connected to the gate line 121, a second terminal thereof is connected to the first data line 171h, and a third terminal thereof is connected to the first liquid crystal capacitor Clch.

A first terminal of the second switching element Ql is connected to the gate line 121, a second terminal thereof is connected to the second data line 171l, and a third terminal thereof is connected to the second liquid crystal capacitor Clcl.

An operation of the liquid crystal display according to the exemplary embodiment of the inventive concept will now be described. When a gate-on voltage is applied to the gate line 121, the first switching element Qh and the second switching element Ql connected to the gate line 121 are turned on, and the first and second liquid crystal capacitors Clch and Clcl are charged by different data voltages transmitted through the first and second data lines 171*h* and 171*l*. The data voltage transmitted by the second data line 171*l* is lower than the data voltage transmitted by the first data line 171*h*. Accordingly, the second liquid crystal capacitor Clcl is charged with a lower voltage than that of the first liquid crystal capacitor Clch, thereby improving side visibility.

Hereinafter, a structure of one pixel of the liquid crystal display according to the exemplary embodiment of the inventive concept will be described with reference to FIGS. 3 to 5.

Figure 3:
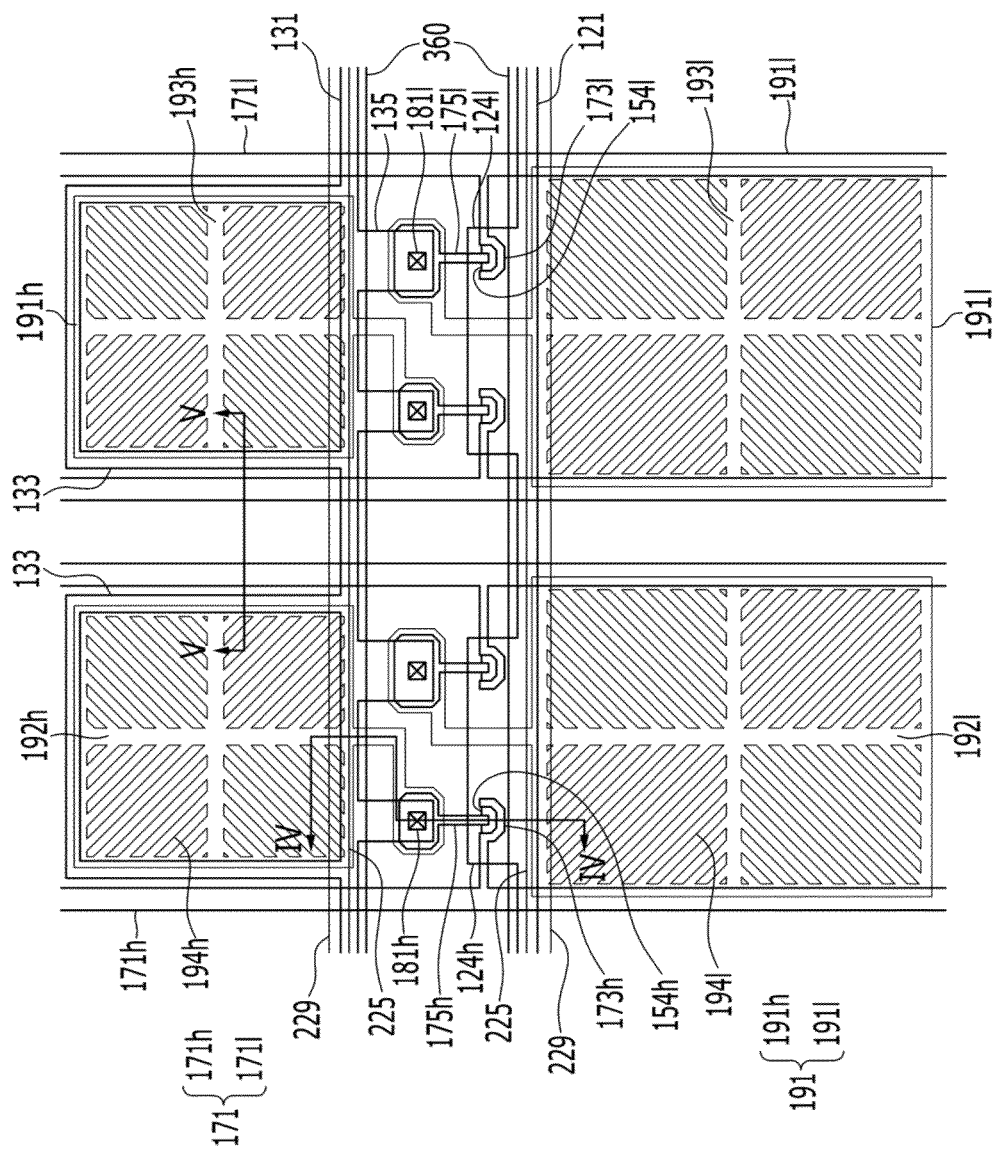
FIG. 3 is a partial layout view of a display device according to an exemplary embodiment of the inventive concept.
Figure 4:
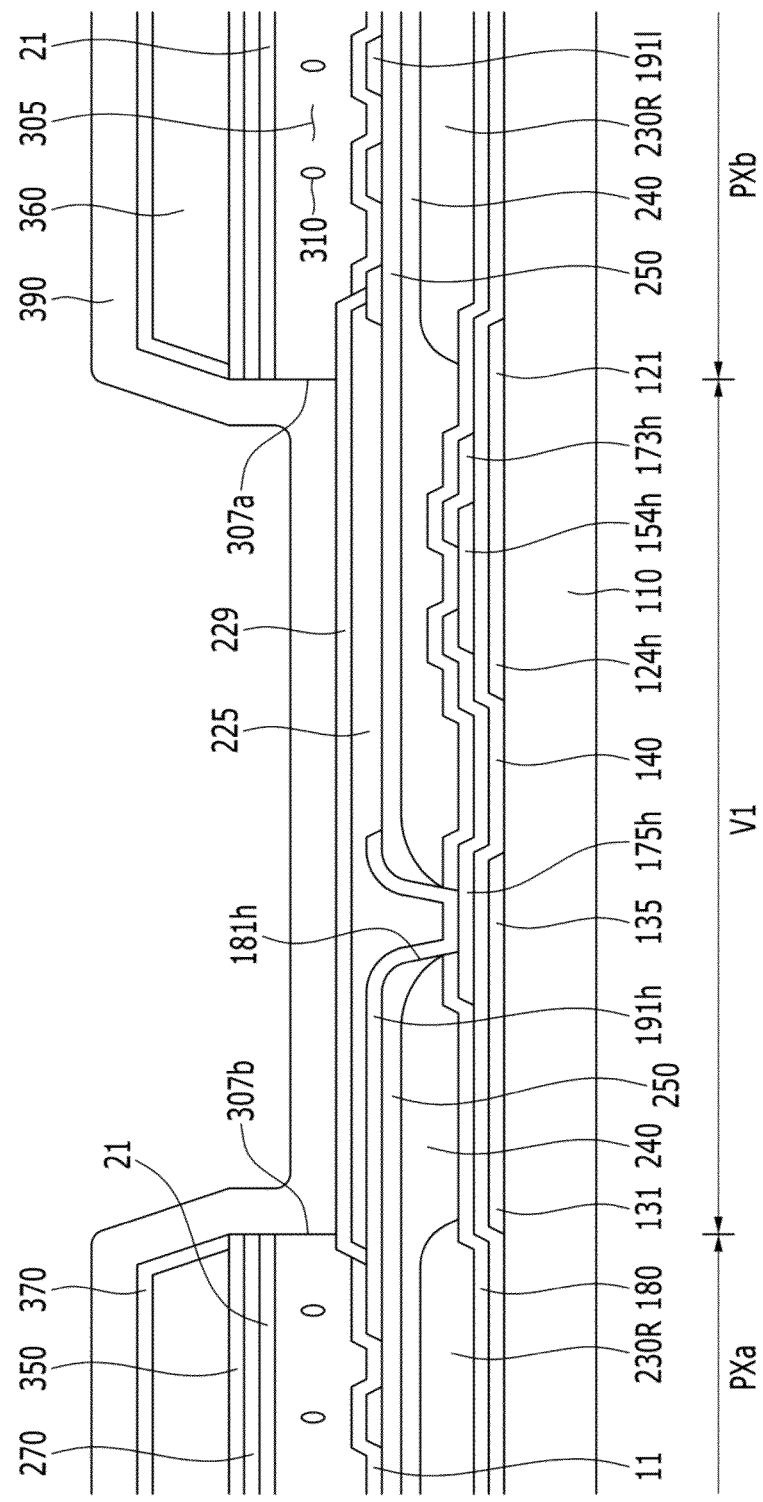
FIG. 4 is a cross-sectional view of a display device according to an exemplary embodiment of the inventive concept taken along the line IV-IV of FIG. 3.

FIG. 3 is a partial layout view of a display device according to an exemplary embodiment of the inventive concept, and FIG. 4 is a cross-sectional view of a display device according to an exemplary embodiment of the inventive concept taken along the line IV-IV of FIG. 3. FIG. 5 is a cross-sectional view of a display device according to an exemplary embodiment of the inventive concept taken along the line V-V of FIG. 3, and FIG. 6 is a layout view of a partial layer of a display device according to an exemplary embodiment of the inventive concept.

Figure 5:
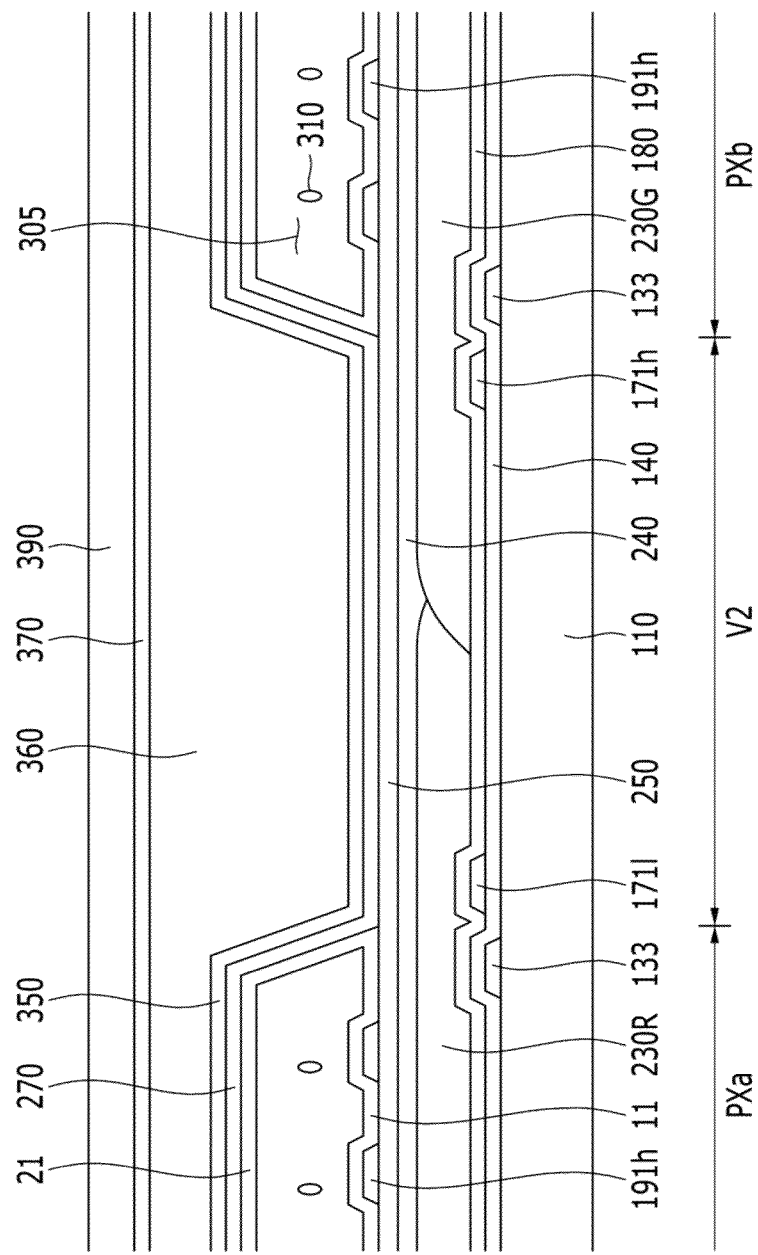
FIG. 5 is a cross-sectional view of a display device according to an exemplary embodiment of the inventive concept taken along the V-V of FIG. 3.
Figure 6:
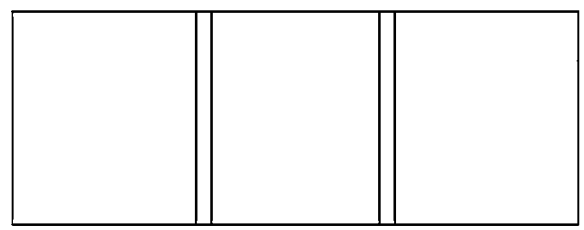
FIG. 6 is a layout view of a partial layer of a display device according to an exemplary embodiment of the inventive concept.
Figure 6:
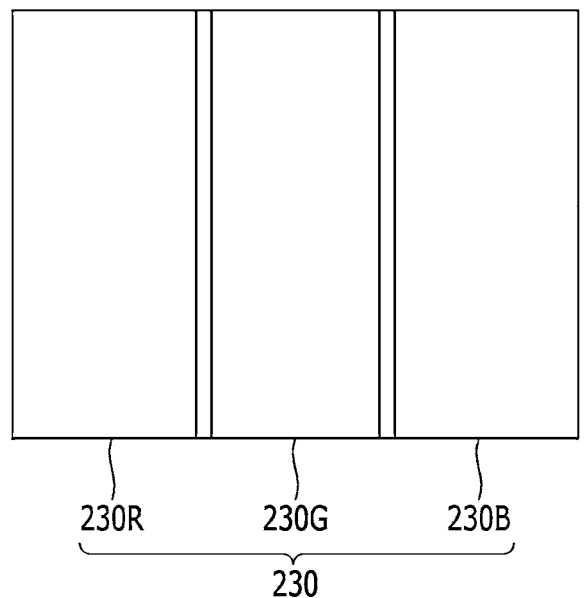

Referring to FIGS. 3 to 5, the gate line 121 and a first gate electrode 124*h* and a second gate electrode 124*l* protruding from the gate line 121 are formed on the substrate 110.

The gate line 121 mainly extends in a first direction, and transmits a gate signal. The gate line 121 is disposed between the two microcavities 305 which are adjacent in a column direction. That is, the gate line 121 is disposed at the first valley V1. The first gate electrode 124*h* and the second gate electrode 124*l* protrude upward from the gate line 121 in a plane view. The first gate electrode 124*h* and the second gate electrode 124*l* are connected to each other to form one protrusion. However, the inventive concept is not limited thereto, and the protrusion shape of the first gate electrode 124*h* and the second gate electrode 124*l* may be variously modified.

A storage electrode line 131 and storage electrode 133 and 135 protruding from the storage electrode line 131 may be further formed on the substrate 110.

The storage electrode line 131 extends in a direction parallel to the gate line 121, and is formed to be spaced apart from the gate line 121. A predetermined voltage may be applied to the storage electrode line 131. The storage electrode 133 protruding upward from the storage electrode line 131 is formed to enclose the edge of the first subpixel PXa. The storage electrode 135 protruding downward from the storage electrode line 131 is formed to be adjacent to the first gate electrode 124*h* and the second gate electrode 124*l*.

A gate insulating layer 140 is formed on the gate line 121, the first gate electrode 124*h*, the second gate electrode 124*l*, the storage electrode line 131, and the storage electrodes 133 and 135. The gate insulating layer 140 may be formed of an inorganic insulating material, such as a silicon nitride (SiNx) and a silicon oxide (SiOx). Further, the gate insulating layer 140 may be formed of a single layer or a multilayer.

A first semiconductor 154*h* and a second semiconductor 154*l* are formed on the gate insulating layer 140. The first semiconductor 154*h* may be disposed on the first gate electrode 124*h*, and the second semiconductor 154*l* may be disposed on the second gate electrode 124*l*. The first semiconductor 154*h* may be elongated to a lower portion of the first data line 171*h*, and the second semiconductor 154*l* may be elongated to a lower portion of the second data line 171*l*. The first semiconductor layer 154*h* and the second semiconductor 154*l* may be formed of amorphous silicon, polycrystalline silicon, an oxide semiconductor, or the like.

An ohmic contact member (not illustrated) may be formed on each of the first semiconductor 154*h* and the second semiconductor 154*l*. The ohmic contact members may be made of a silicide or a material such as n+ hydrogenated amorphous silicon on which an n-type impurity is doped at a high concentration.

The first data line 171*h*, the second data line 171*l*, a first source electrode 173*h*, a first drain electrode 175*h*, a second source electrode 173*l*, and a second drain electrode 175*l* are formed on the first semiconductor 154*h*, the second semiconductor 154*l*, and the gate insulating layer 140.

The first data line 171*h* and the second data line 171*l* transfer data signals, and mainly extend in a second direction to cross the gate line 121 and the storage electrode line 131. The data line 171 is disposed between the two microcavities 305 which are adjacent in the row direction. That is, the data line 171 is disposed at the second valley V2.

The first data line 171*h* and the second data line 171*l* transmit different data voltages. The data voltage transmitted by the second data line 171*l* is lower than the data voltage transmitted by the first data line 171*h*.

The first source electrode 173*h* is formed so as to protrude on the first gate electrode 124*h* from the first data line 171*h*, and the second source electrode 173*l* is formed so as to protrude on the second gate electrode 124*l* from the second data line 171*l*. Each of the first drain electrode 175*h* and the second drain electrode 175*l* has one wide end portion and the other rod-shaped end portion. The wide end portions of the first drain electrode 175*h* and the second drain electrode 175*l* overlap the storage electrode 135 protruding downward from the storage electrode line 131. Each of the rod-shaped end portions of the first drain electrode 175*h* and the second drain electrode 175*l* is partially surrounded by the first source electrode 173*h* and the second source electrode 173*l*.

The first and second gate electrodes 124*h* and 124*l*, the first and second source electrodes 173*h* and 173*l*, and the first and second drain electrodes 175*h* and 175*l* form first and second thin film transistors (TFT) Qh and Ql together with the first and second semiconductors 154*h* and 154*l*, and channels of the thin film transistors are formed in the semiconductors 154*h* and 154*l* between the source electrodes 173*h* and 173*l* and the drain electrodes 175*h* and 175*l*, respectively.

A passivation layer 180 is formed on the first semiconductor 154*h* exposed between the first data line 171*h*, the second data line 171*l*, the first source electrode 173*h*, and the first drain electrode 175*h*, and the second semiconductor 154*l* exposed between the second source electrode 173*l*, the second drain electrode 175*l*, the second source electrode 173*l*, and the second drain electrode 175*l*. The passivation layer 180 may be formed of an organic insulating material or an inorganic insulating material, and formed of a single layer or a multilayer.

A color filter 230 is formed in each pixel PX on the passivation layer 180. The color filter 230, referring to FIG. 6, may include a first color filter 230R, a second color filter 230G, and a third color filter 230B. FIG. 6 shows the color filters 230 formed at three adjacent pixels PXs. At this time, the first color filter 230R, the second color filter 230G, and the third color filter 230B may respectively display three primary colors such as red, green, and blue.

The first color filter 230R and the second color filter 230G overlap each other. The edge of the first color filter 230R and the edge of the second color filter 230G may overlap each other. The first color filter 230R and the second color filter 230G overlap each other at the second valley V2. By the overlapping of the first color filter 230R and the second color filter 230G, an empty space may not be formed between the first color filter 230R and the second color filter 230G, and may prevent generation of a step.

Likewise, the second color filter 230G and the third color filter 230B may overlap each other at the second valley V2. Also, the third color filter 230B and the first color filter 230R may overlap each other at the second valley V2.

The color filter 230 may not be formed at the first valley V1.

In the above, the color filter 230 includes the color filters representing three colors, however the inventive concept is not limited thereto, and color filters 230 representing more colors may be included. For example, the color filter 230 is not limited to the three primary colors of red, green, and blue, and may include cyan, magenta, yellow, and a white-based color.

A first insulating layer 240 may be further formed on the color filter 230. The first insulating layer 240 may be formed of an organic insulating material, and may serve to planarize the color filters 230. The first insulating layer 240 may be omitted if necessary.

A second insulating layer 250 may be further formed on the first insulating layer 240. The second insulating layer 250 may be formed of an inorganic insulating material, and may serve to protect the color filter 230 and the first insulating layer 240. The second insulating layer 250 may be omitted if necessary.

A first contact hole 181h through which the wide end portion of the first drain electrode 175h is exposed, and a second contact hole 181l through which the wide end portion of the second drain electrode 175l is exposed, are formed in the passivation layer 180, the first insulating layer 240, and the second insulating layer 250.

A pixel electrode 191 is formed on the second insulating layer 250. The pixel electrode 191 may be formed of a transparent metal oxide material, such as indium-tin oxide (ITO) and indium-zinc oxide (IZO).

The pixel electrode 191 includes a first subpixel electrode 191h and a second subpixel electrode 191l which are separated from each other with the gate line 121 and the storage electrode line 131 interposed therebetween. The first subpixel electrode 191h and the second subpixel electrode 191l are disposed on each side of the gate line 121 and the storage electrode line 131. That is, the first subpixel electrode 191h and the second subpixel electrode 191l are separated from each other by the first valley V1 interposed therebetween, and the first subpixel electrode 191h is disposed in the first subpixel PXa and the second subpixel electrode 191l is disposed in the second subpixel PXb.

The first subpixel electrode 191h is connected to the first drain electrode 175h through the first contact hole 185h, and the second subpixel electrode 191l is connected to the second drain electrode 175l through the second contact hole 181l. Accordingly, when the first thin film transistor Qh and the second thin film transistor Ql are turned on, the first subpixel electrode 191h and the second subpixel electrode 191l receive different data voltages from the first drain electrode 175h and the second drain electrode 175l, respectively. An electric field may be formed between the pixel electrode 191 and a common electrode 270.

An overall shape of each of the first subpixel electrode 191h and the second subpixel electrode 191l is a quadrangle, and the first subpixel electrode 191h and the second subpixel electrode 191l include cross-shaped stem portions formed by horizontal stem portions 193h and 193l and vertical stem portions 192h and 192l crossing the horizontal stem portions 193h and 193l, respectively. Further, each of the first subpixel electrode 191h and the second subpixel electrode 191l includes a plurality of minute branch portions 194h and 194l.

Each subpixel electrodes PXa and PXb of the pixel electrode 191 is divided into four subregions by the horizontal stem portions 193h and 193l and the vertical stem portions 192h and 192l, respectively. The minute branch portions 194h and 194l obliquely extend from the horizontal stem portions 19h1 and 193l and the vertical stem portions 192h and 192l, and the extension direction may form an angle of approximately 45° or 135° with the gate line 121 or the horizontal stem portions 193h and 193l. Further, the directions in which the minute branch portions 194h and 194l in the two adjacent subregions may extend orthogonal to each other.

In the present exemplary embodiment, the first subpixel electrode 191h and the second subpixel electrode 191l may further include outer stem portions surrounding outer sides of the first subpixel PXa and the second subpixel PXb, respectively.

The arrangement form of the pixel, the structure of the thin film transistor, and the shape of the pixel electrode described above are one example, but the inventive concept is not limited thereto, and various modifications are feasible.

A light blocking member 225 is formed on the pixel electrode 191 and the second insulating layer 250. The light blocking member 225 is formed of a material that blocks light, thereby preventing light leakage.

The light blocking member 225 is disposed at the first valley V1. The thin film transistors Qh and Ql are disposed at the first valley V1, and the light blocking member 225 is disposed to overlap the thin film transistors Qh and Ql. Furthermore, the light blocking member 225 may be formed to further overlap the gate line 121 and the storage electrode line 131. Particularly, the light blocking member 225 is formed to cover the first contact hole 181h and the second contact hole 181l formed to connect the thin film transistors Qh and Ql and the pixel electrode 191 including the first subpixel electrode PXa and the second pixel electrode PXb.

In the present exemplary embodiment, the light blocking member 225 is not formed under the pixel electrode 191 but formed on the pixel electrode 191.

In a case in which the light blocking member 225 is only formed under the pixel electrode 191, the light blocking member 255 is removed at the portion where the first contact hole 191h and the second contact hole 191l are disposed. Accordingly, light incident to the first contact hole 191h and the second contact hole 191l is reflected such that the reflected light may be recognized by the viewer thereby deteriorate contrast ratio of the display device. In the present exemplary embodiment, the light blocking member 225 is formed on the pixel electrode 191 thereby covering the first contact hole 191h and the second contact holes 191l. Accordingly, the reflection of light may be prevented at the contact portion of the thin film transistors Qh and Ql and the pixel electrode 191 thereby prevent the deterioration of the contrast ratio.

In a case in which two light blocking member 225 is formed on and under the pixel electrode 191 to prevent the deterioration of the contrast ratio, a process of patterning the light blocking member 225 has to be performed twice. Accordingly, cost and time according to the additional process are increased. In the present exemplary embodiment, however, by forming the light blocking member 225 only on the pixel electrode 191, the reflection of light may be prevented at the contact portion of the thin film transistors Qh and Ql and the pixel electrode 191 without the additional process.

A light blocking member protection layer 229 is formed on the light blocking member 225. The light blocking member protection layer 229 is disposed at the first valley V1. The light blocking member protection layer 229 is formed to overlap the thin film transistors Qh and Ql, the gate line 121, and the storage electrode line 131. The light blocking member protection layer 229 may be made of the inorganic insulating material such as a silicon nitride (SiNx) and a silicon oxide (SiOx), thereby protecting the light blocking member 225.

The common electrode 270 is formed on the pixel electrode 191 so as to be spaced apart from the pixel electrode 191 by a predetermined distance. The microcavity 305 is formed between the pixel electrode 191 and the common electrode 270. That is, the microcavity 305 is surrounded by the pixel electrode 191 and the common electrode 270. The common electrode 270 extends in the row direction and is disposed on the microcavity 305 and at the second valley V2. The common electrode 270 is formed to surround the upper portion and the side portion of the microcavity 305. A width and an area of the microcavity 305 may be variously modified according to a size and resolution of the display device.

The inventive concept is not limited thereto, and the common electrode 270 may be formed on or under the insulating layer disposed between the pixel electrode 191 and the common electrode 270. Further, the common electrode 270 and the pixel electrode 191 are disposed at the same layer alternately. Here, the microcavity 305 is not formed between the pixel electrode 191 and the common electrode 270, and the microcavity 305 may be formed on the pixel electrode 191 and the common electrode 270.

The common electrode 270 may be made of a transparent metal oxide material such as indium-tin oxide (ITO), indium-zinc oxide (IZO), and the like. The predetermined voltage may be applied to the common electrode 270, and an electric field may be formed between the pixel electrode 191 and the common electrode 270.

A first alignment layer 11 is formed on the pixel electrode 191. The first alignment layer 11 may also be formed directly on the second insulating layer 250 which is not covered by the pixel electrode 191.

A second alignment layer 21 is formed under the common electrode 270 so as to face the first alignment layer 11.

The first alignment layer 11 and the second alignment layer 21 may be formed of vertical alignment layers, and may be formed of an alignment material such as polyamic acid, polysiloxane, and polyimide. The first and second alignment layers 11 and 21 may be connected on a side portion of the microcavity 305.

A liquid crystal layer formed of liquid crystal molecules 310 is formed in the microcavity 305 between the pixel electrode 191 and the common electrode 270. The liquid crystal molecules 310 have negative dielectric anisotropy, and may be aligned in a vertical direction to the substrate 110 in a state where an electric field is not applied. That is, vertical alignment may be realized.

The inventive concept is not limited thereto, and the liquid crystal molecules 310 may have positive dielectric anisotropy. And the liquid crystal molecules may be aligned in a parallel direction to the substrate 110 in a state where an electric field is not applied. That is, parallel alignment may be realized.

In case the microcavity 305 is formed on the pixel electrode 191 and the common electrode 270, the liquid crystal molecules 310 may have positive or negative dielectric anisotropy, and the first alignment layer 11 and the second alignment layer 21 may be formed of parallel alignment layers.

The first subpixel electrode 191h and the second subpixel electrode 191l, to which the data voltage is applied, generate an electric field together with the common electrode 270 to determine a direction of the liquid crystal molecules 310 disposed in the microcavity 305 between the two electrodes 191 and 270. Luminance of light passing through the liquid crystal layer is altered according to the direction of the liquid crystal molecules 310.

A third insulating layer 350 may be further formed on the common electrode 270. The third insulating layer 350 may be formed of an inorganic insulating material, such as a silicon nitride (SiNx) and a silicon oxide (SiOx), and may be omitted if necessary.

A roof layer 360 is formed on the third insulating layer 350. The roof layer 360 may be formed of an organic material. The roof layer 360 extends in the row direction and is disposed on the microcavity 305 and at the second valley V2. The roof layer 360 covers the upper portion and the side portion of the microcavity 305. The roof layer 360 may be hardened by a hardening process to maintain the shape of the microcavity 305. That is, the roof layer 360 is spaced apart from the pixel electrode 191 with the microcavity 305 interposed therebetween.

The common electrode 270 and the roof layer 360 are formed to expose the side portion of the edge of the microcavity 305. The portions where the microcavity 305 is not covered by the common electrode 270 and the roof layer 360 are referred to as injection holes 307a and 307b. The injection holes 307a and 307b includes a first injection hole 307a, through which a lateral surface of a first edge of the microcavity 305 is exposed, and a second injection hole 307b, through which a lateral surface of a second edge of the microcavity 305 is exposed. The first edge and the second edge are edges facing each other, and for example, in the plane view, the first edge may be an upper edge of the microcavity 305, and the second edge may be a lower edge of the microcavity 305. The microcavities 305 are exposed by the injection holes 307a and 307b, so that an alignment layer solution, a liquid crystal material, or the like may be injected into the microcavities 305 through the injection holes 307a and 307b. For example, the alignment layer solution may be injected through only one of the two injection holes 307a and 307b, and the liquid crystal material may be injected through both the two injection holes 307a and 307b.

A fourth insulating layer 370 may be further formed on the roof layer 360. The fourth insulating layer 370 may be formed of the inorganic insulating material such as a silicon nitride (SiNx) and a silicon oxide (SiOx). The fourth insulating layer 370 may be formed to cover the upper surface and the lateral surface of the roof layer 360. The fourth insulating layer 370 protects the roof layer 360 formed of the organic material, and may be omitted if necessary.

An encapsulation layer 390 may be formed on the fourth insulating layer 370. The encapsulation layer 390 is formed so as to cover the injection holes 307a and 307b through which parts of the microcavities 305 are exposed to the outside. That is, the encapsulation layer 390 may seal the microcavity 305 so that the liquid crystal molecules 310 formed in the microcavity 305 are not discharged to the outside. Since the encapsulation layer 390 is in contact with the liquid crystal molecules 310, the encapsulation layer 390 may be preferably formed of a material that does not react with the liquid crystal molecules 310. For example, the encapsulation layer 390 may be formed of Parylene or the like.

The encapsulation layer 390 may be formed of a multilayer such as a double layer or a triple layer. The double layer is formed of two layers formed of different materials. The triple layer is formed of three layers, and materials of the adjacent layers are different from each other. For example, the encapsulation layer 390 may include a layer formed of an organic insulating material and a layer formed of an inorganic insulating material.

The inventive concept is not limited thereto, and the encapsulation layer 390 may be formed of a multilayer comprising four layers or more. At this time, an organic insulating layer and an inorganic insulating layer are stacked alternately.

Although not illustrated in the drawings, a polarizer may be further formed on upper and lower surfaces of the display device. The polarizer may be formed of a first polarizer and a second polarizer. The first polarizer may be attached to a lower surface of the substrate 110, and the second polarizer may be attached onto the encapsulation layer 390. The first polarizer and the second polarizer may be crossed rectilinear polarizers.

Next, an example of actually manufacturing the display device according to an exemplary embodiment of the inventive concept will be described with reference to FIG. 7 to FIG. 12.

Figure 7:
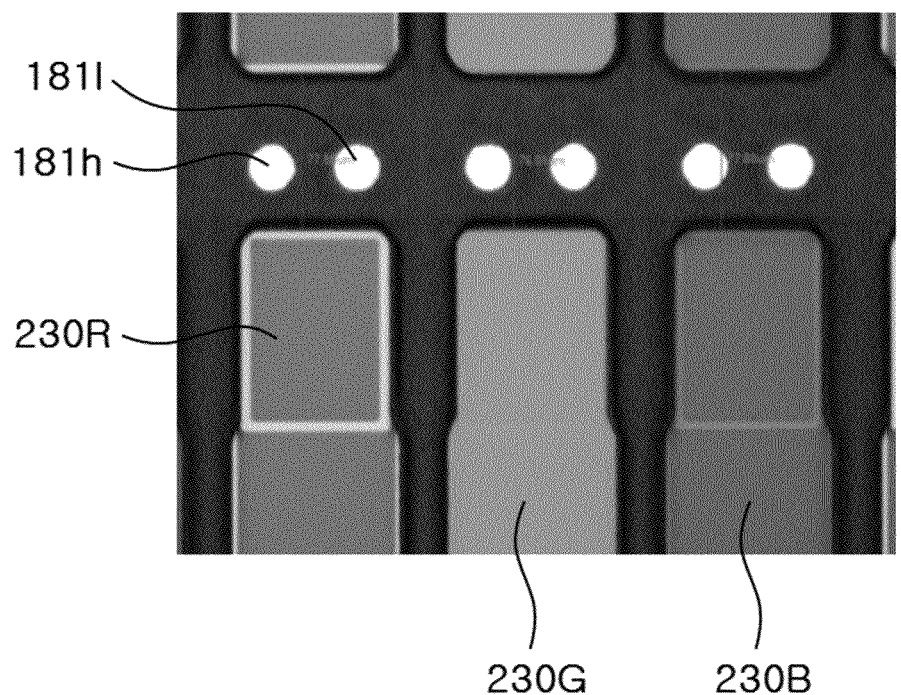
FIG. 7 is a top plan view of a display device according to a comparative example.
Figure 8:
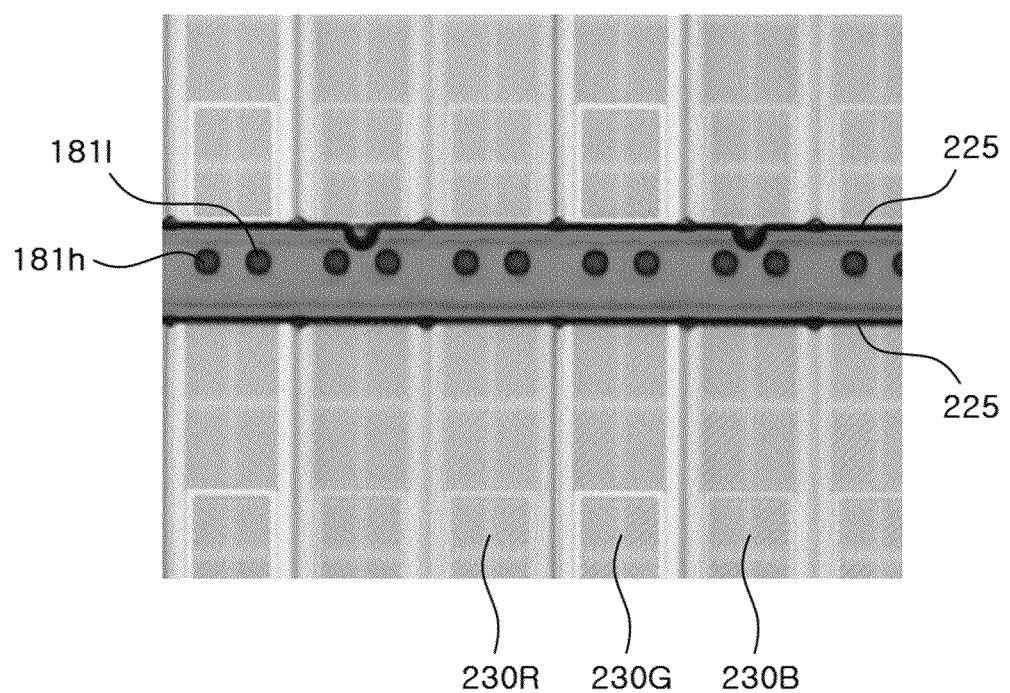
FIG. 8 is a top plan view of a display device according to an exemplary embodiment of the inventive concept.

Firstly, referring to FIG. 7 and FIG. 8, in the display device according to an exemplary embodiment of the inventive concept, the reflection light is not generated due to the light blocking member 225 on the contact holes.

FIG. 7 is a top plan view of a display device according to a comparative example, and FIG. 8 is a top plan view of a display device according to an exemplary embodiment of the inventive concept. FIG. 7 and FIG. 8 are scanning electron microscope (SEM) images showing a state of forming to the light blocking member.

In the display device shown in FIG. 7, the light blocking member is formed only under the pixel electrode. In this case, it may be confirmed that the reflection light is generated at the portion where first contact hole 181h and the second contact hole 181l are formed because the light blocking member is not formed on the contact holes 181h and 181l.

In an exemplary embodiment of the inventive concept, as shown in FIG. 8, by forming the light blocking member 225 on the contact holes which include the first contact hole 181h and the second contact hole 181l on the pixel electrode, it may be confirmed that the reflection light is not generated at the portion where first contact hole 181h and the second contact hole 181l are formed.

Next, a portion where the color filters overlap each other in the display device according to an exemplary embodiment of the inventive concept will be described with reference to FIG. 9 and FIG. 10.

Figure 9:
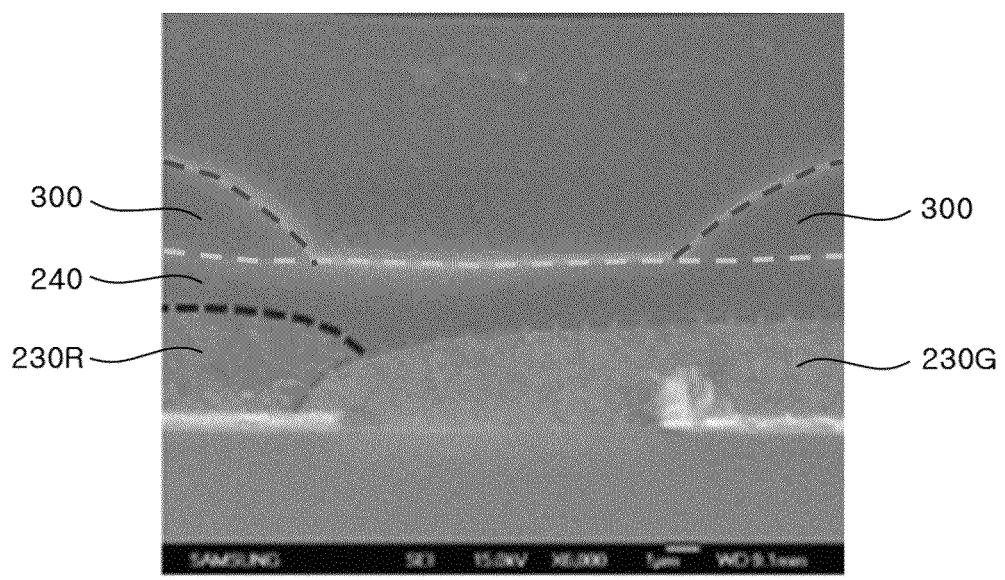
FIG. 9 is a cross-sectional view of a display device according to an exemplary embodiment of the inventive concept.
Figure 10:
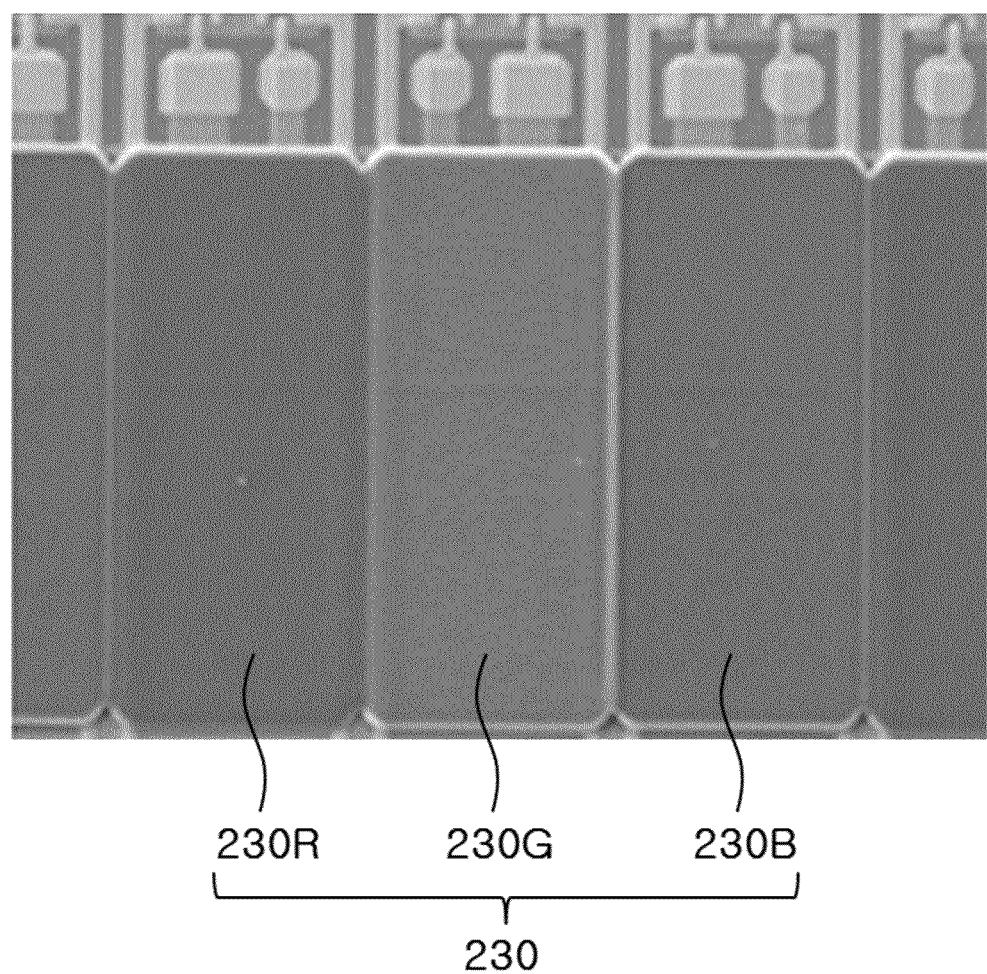
FIG. 10 is a top plan view of a display device according to an exemplary embodiment of the inventive concept.

FIG. 9 is a cross-sectional view of a display device according to an exemplary embodiment of the inventive concept, and FIG. 10 is a top plan view of a display device according to an exemplary embodiment of the inventive concept. FIG. 9 and FIG. 10 are the SEM images picturing a state that a sacrificial layer that will be described later is formed on the first insulating layer.

As shown in FIG. 9 and FIG. 10, the first color filter 230R and the second color filter 230G overlap each other, the second color filter 230G and the third color filter 230B overlap each other, and the third color filter 230B and the first color filter 230R overlap each other. By forming the color filters 230 to overlap each other, a space is not generated between the color filters 230, thereby preventing step generation. Also, by forming the first insulating layer 240 on the color filter 230, it may be confirmed that the planarized surface is obtained.

Next, a shape in which the roof layer and the microcavity are formed in the display device according to an exemplary embodiment of the inventive concept will be described with reference to FIG. 11 and FIG. 12.

Figure 11:
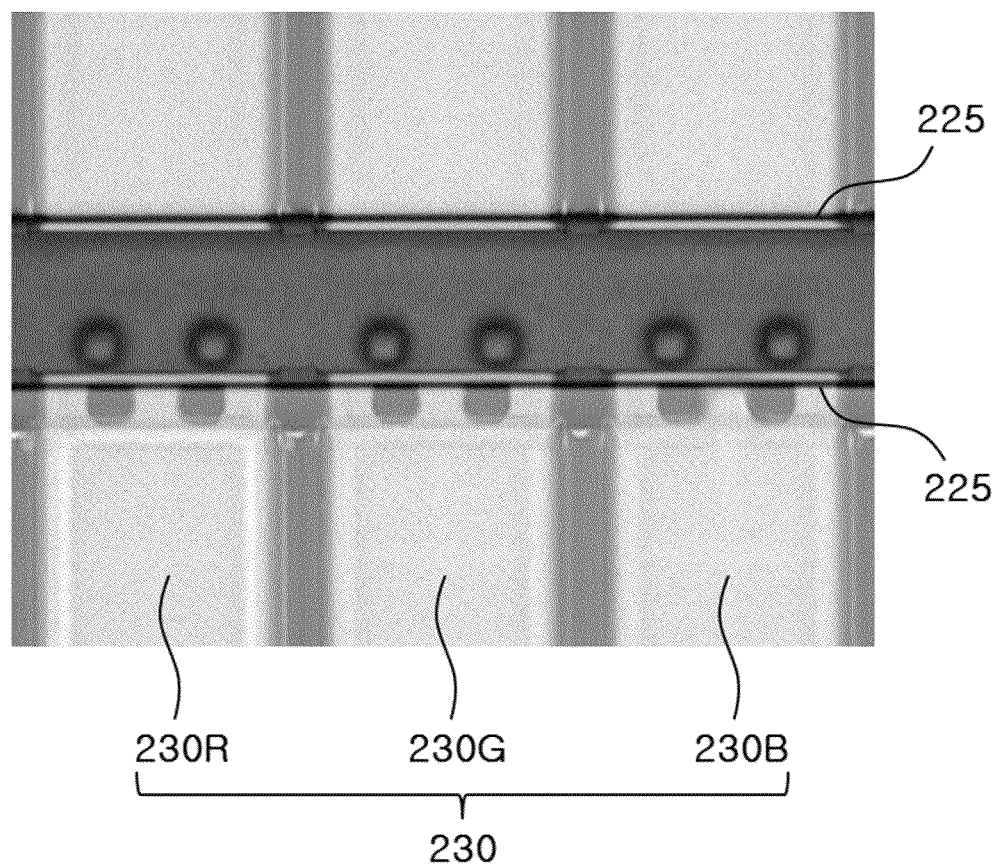
FIG. 11 is a top plan view of a display device according to an exemplary embodiment of the inventive concept.
Figure 12:
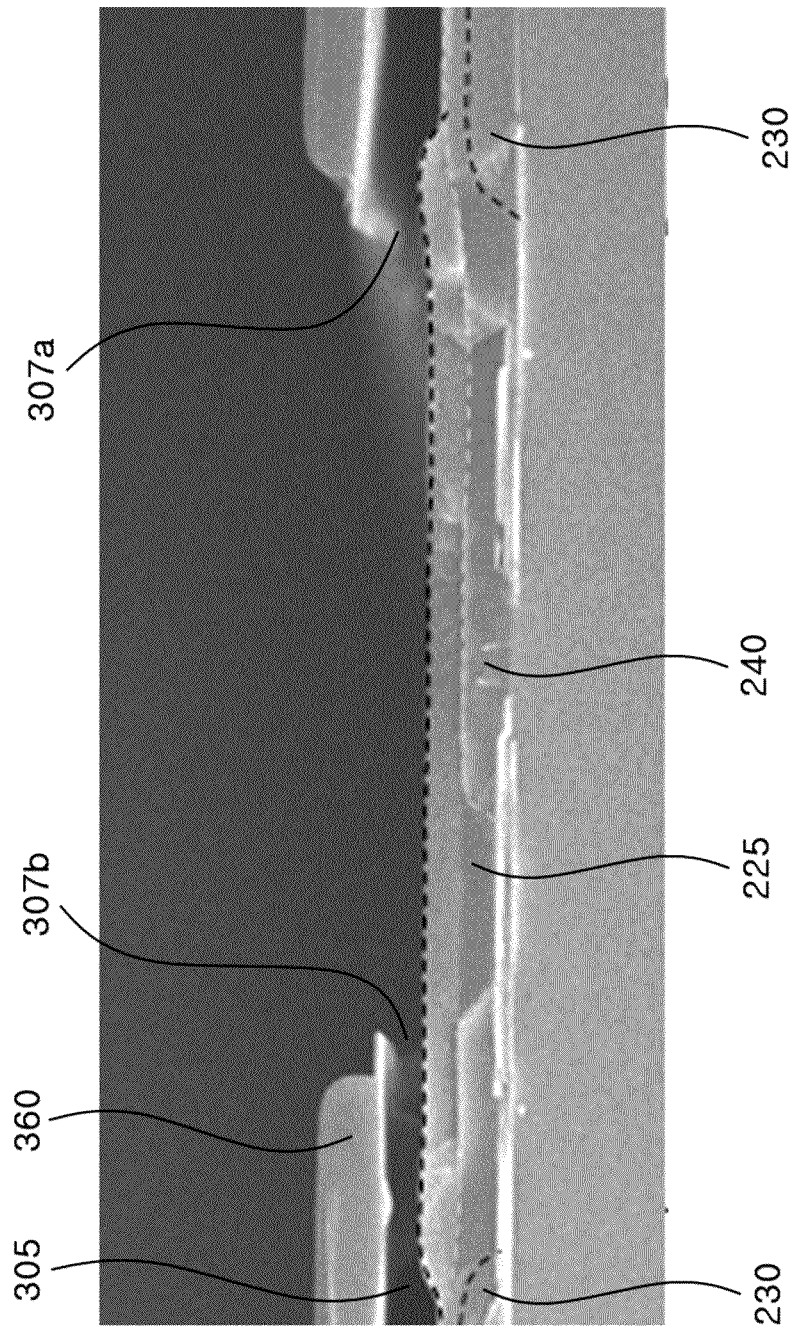
FIG. 12 is a cross-sectional view of a display device according to an exemplary embodiment of the inventive concept.

FIG. 11 is a top plan view of a display device according to an exemplary embodiment of the inventive concept, and FIG. 12 is a cross-sectional view of a display device according to an exemplary embodiment of the inventive concept. FIG. 11 and FIG. 12 are SEM images showing a state that the microcavity is formed under the roof layer.

As shown in FIG. 11 and FIG. 12, the light blocking member 225 is formed at the region between two adjacent microcavities 305. The light blocking member 225 may overlap the edge of the microcavity 305. At this time, the color filter 230 and the light blocking member 225 may partially overlap, thereby generating the step. For forming the microcavity 305, it may be confirmed that a process of removing the sacrificial layer is required, and the removal of the sacrificial layer is easily performed in spite of the step. That is, it may be confirmed that the microcavity 305 is formed under the roof layer 360. The light blocking member 225 overlap the TFT which includes the first and second gate electrodes 124h and 124l, the first and second source electrodes 173h and 173l, and the first and second drain electrodes 175h and 175l, the first and second semiconductors 154h and 154l, the storage electrode line 131, and the storage electrode 135. The light blocking member 225 may directly contact the pixel electrode 191 which includes the first subpixel electrode 191h and the second subpixel electrode 191l. The light blocking member 225 may be formed to partially overlap the gate line 121 and the storage electrode line 131.

Next, a manufacturing method of a display device according to an exemplary embodiment of the inventive concept will be described with reference to FIG. 13 to FIG. 20. Furthermore, the manufacturing method will be described along with FIG. 1 to FIG. 6.

FIG. 13 to FIG. 20 are process cross-sectional views of a manufacturing method of a display device according to an exemplary embodiment of the inventive concept. FIG. 13, FIG. 15, FIG. 17, and FIG. 19 are cross-sectional views taken along the same line, and FIG. 14, FIG. 16, FIG. 18, and FIG. 20 are cross-sectional views taken along the same line.

Figure 13:
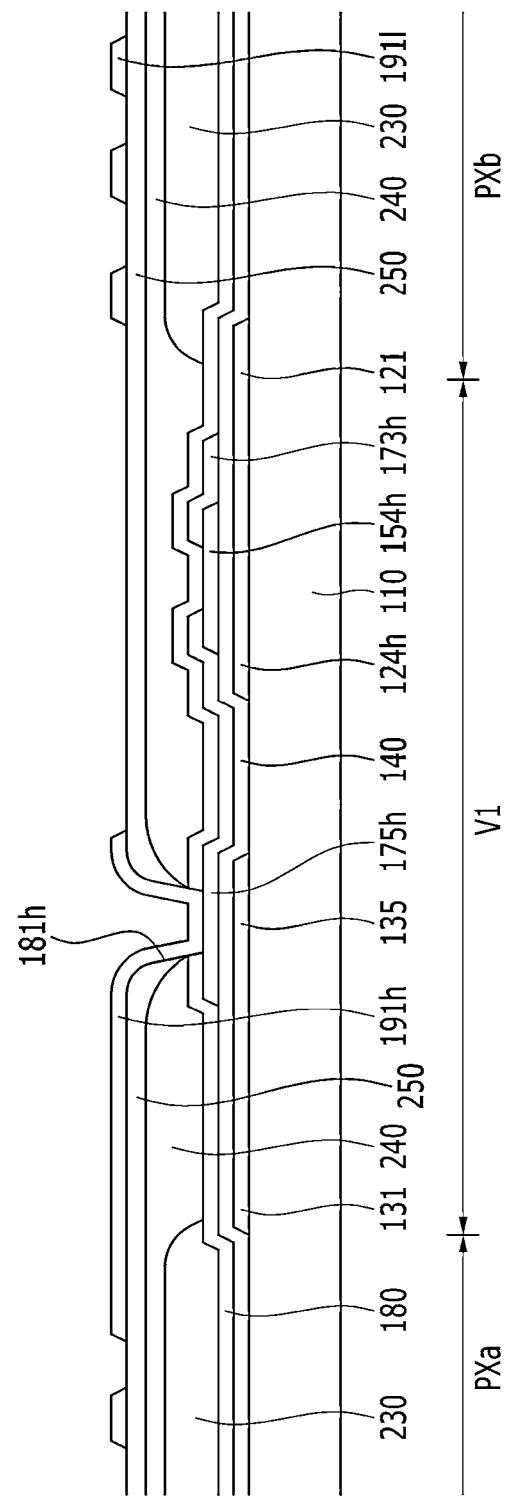
FIG. 13 to FIG. 20 are process cross-sectional views of a manufacturing method of a display device according to an exemplary embodiment of the inventive concept.
Figure 14:
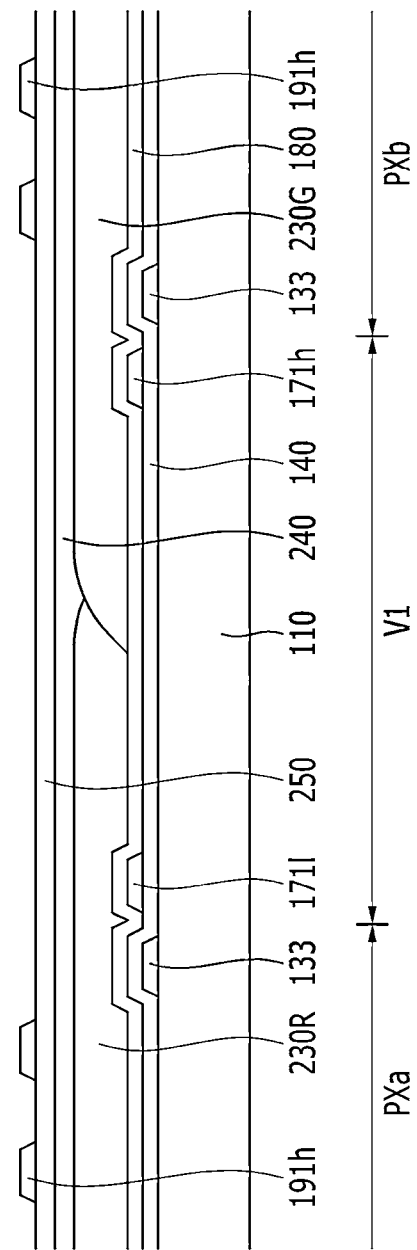

Firstly, as shown in FIG. 3, 13 and FIG. 14, a gate line 121 extending in the first direction, and a first gate electrode 124h and a second gate electrode 124l protruding from the gate line 121, are formed on a substrate 110 made of glass or plastic. The first gate electrode 124h and the second gate electrode 124l are connected to each other, thereby forming one protrusion.

Also, a storage electrode line 131 separated from the gate line 121 and storage electrodes 133 and 135 protruding from the storage electrode line 131 may be formed together. The storage electrode line 131 extends parallel to the gate line 121. The storage electrode 133 protruding upward from the storage electrode line 131 may be formed to surround an edge of a first subpixel area PXa, and the storage electrode 135 protruding downward from the storage electrode line 131 may be formed to be adjacent to the first gate electrode 124h and the second gate electrode 124l. The storage electrode 135 protruding downward from the storage electrode line 131 may extend under the contact holes which include the first contact hole 181h and the second contact hole 181l to be formed later.

Next, a gate insulating layer 140 is formed on the gate line 121, the first gate electrode 124h, the second gate electrode 124l, the storage electrode line 131, and the storage electrodes 133 and 135 by using an inorganic insulating material such as a silicon oxide (SiOx) or a silicon nitride (SiNx). The gate insulating layer 140 may be formed as a single layer or a multiple layer.

Next, a first semiconductor 154h and a second semiconductor 154l are formed by depositing and then patterning a semiconductor material such as amorphous silicon, polycrystalline silicon, and an oxide semiconductor on the gate insulating layer 140. The first semiconductor 154h may be formed to be disposed on the first gate electrode 124h, and the second semiconductor 154l may be formed to be disposed on the second gate electrode 124l.

Next, a first data line 171h and a second data line 171l extending in the second direction are formed by depositing and then patterning a metal material. The metal material may be formed as a single layer or a multiple layer.

Further, a first source electrode 173h protruding above the first gate electrode 124h from the first data line 171h, and a first drain electrode 175h spaced apart from the first source electrode 173h, are formed together with the first data line 171h and the second data line 171l. In addition, a second source electrode 173l protruding above the second gate electrode 124l from the second data line 171l and a second drain electrode 175l spaced apart from the second source electrode 173l are formed together with the first data line 171h and the second data line 171l.

The first and second semiconductors 154h and 154l, the first and second data lines 171h and 171l, the first and second source electrodes 173h and 173l, and the first and second drain electrodes 175h and 175l may be formed by sequentially depositing and then simultaneously patterning a semiconductor material and a metal material. In this case, the first semiconductor 154h is formed below the first data line 171h, and the second semiconductor 154l is formed below the second data line 171l.

The first and second gate electrodes 124h and 124l, the first and second source electrodes 173h and 173l, and the first and second drain electrodes 175h and 175l form first and second thin film transistors (TFTs) Qh and Ql together with the first and second semiconductors 154h and 154l, respectively.

Next, a passivation layer 180 is formed on the first data line 171h, the second data line 171l, the first source electrode 173h, the first drain electrode 175h, the first semiconductor 154h exposed between the first source electrode 173h and the first drain electrode 175h, the second source electrode 173l, the second drain electrode 175l, and the second semiconductor 154l exposed between the second source electrode 173l and the second drain electrode 175l. The passivation layer 180 may be made of an organic insulating material or an inorganic insulating material, and may be formed as a single layer or a multiple layer.

A color filter 230 is then formed on the passivation layer 180. The color filter 230 may be formed within the first subpixel PXa and the second subpixel PXb, and may not be formed at the first valley V1. Color filters 230 of the same color may be formed along the column direction of the plurality of pixel areas PX. For example, when forming the color filter 230 of three colors, the first color filter 230R is formed and then the color filter 230 of the second color filter 230G is formed by shifting a mask. Next, after forming the second color filter 230G, the third color filter 230B may be formed by shifting the mask.

The first color filter 230R and the second color filter 230G are formed to overlap each other at the second valley V2. Also, the second color filter 230G and the third color filter 230G are formed to overlap each other at the second valley V2, and the third color filter 230G and the first color filter 230R are formed to overlap each other at the second valley V2.

Next, a first insulating layer 240 of the organic insulating material is formed on the color filter 230, and a second insulating layer 250 of the inorganic insulating material is formed on the first insulating layer 240.

The passivation layer 180, the first insulating layer 240, and the second insulating layer 250 are patterned to form a first contact hole 181h exposing at least a portion of the first drain electrode 175h and a second contact hole 181 exposing at least a portion of the second drain electrode 175l. At this time, the passivation layer 180, the first insulating layer 240, and the second insulating layer 250 may be simultaneously patterned, may be separately patterned, or may be partially and simultaneously patterned.

The transparent metal oxide material such as ITO or IZO is deposited and patterned on the second insulating layer 250 to form a pixel electrode 191 in the pixel area PX. The pixel electrode 191 includes a first subpixel electrode 191h disposed in the first subpixel area PXa, and a second subpixel electrode 191l disposed in the second subpixel area PXb. The first subpixel electrode 191h and the second subpixel electrode 191l are separated from each other by a first valley V1 formed therebetween.

Horizontal stem portions 193h and 193l, and vertical stem portions 192h and 192l crossing the horizontal stem portions 193h and 193l are formed in the first subpixel electrode 191h and the second subpixel electrode 191l, respectively. Further, a plurality of minute branches 194h and 194l, which obliquely extend from the horizontal stem portions 193h and 193l and the vertical stem portions 192h and 192l, are formed. The horizontal stem portions 193h and 193l, vertical stem portions 192h and 192l, and the plurality of minute branches 194h and 194l may be formed at the same time.

Figure 15:
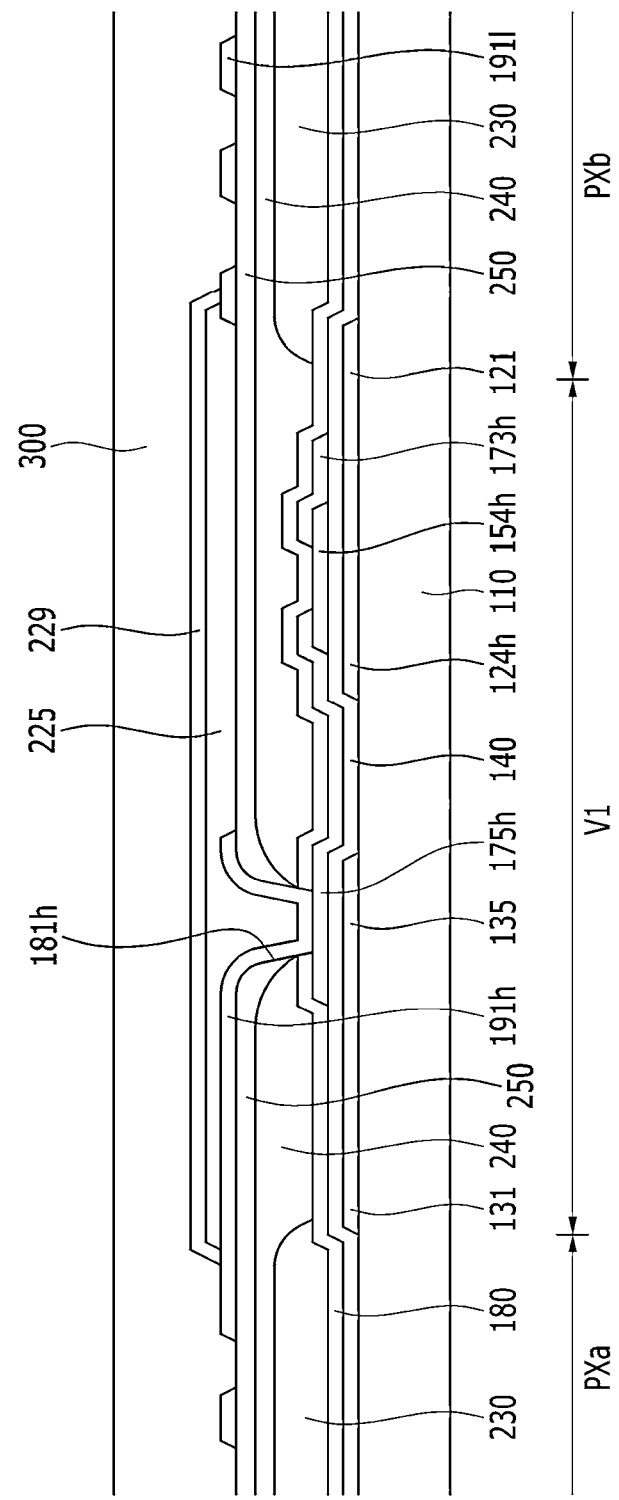
Figure 16:
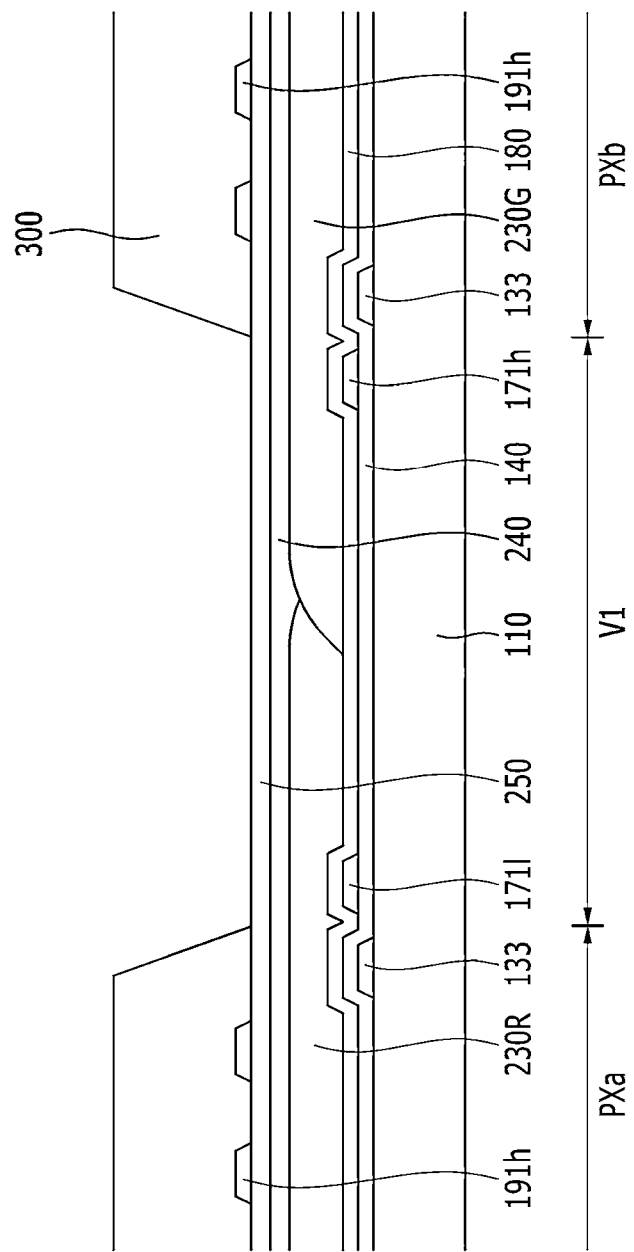

As shown in FIG. 15 and FIG. 16, a light blocking member 225 is formed on the pixel electrode 191 and the second insulating layer 250 using the material blocking the light.

The light blocking member 225 is disposed at the first valley V1. The thin film transistors Qh and Ql are disposed in the first valley V1, and the light blocking member 225 is formed to overlap the thin film transistors Qh and Ql. Further, the light blocking member 225 may be formed to partially overlap the gate line 121 and the storage electrode line 131. Particularly, the light blocking member 225 is formed to cover the first contact hole 181h and the second contact hole 181l formed for the connection between the thin film transistors Qh and Ql and the pixel electrode 191.

In the present exemplary embodiment, the light blocking member 225 is not formed under the pixel electrode 191 but is formed on the pixel electrode 191. The light blocking member 225 may directly contact the pixel electrode 191.

Next, a light blocking member protection layer 229 is formed on the light blocking member 225 using the inorganic insulating material such as a silicon nitride (SiNx) and a silicon oxide (SiOx). The light blocking member protection layer 229 is disposed at the first valley V1 so as to cover the upper surface and the lateral surface of the light blocking member 225.

Next, a photosensitive organic material is coated on the pixel electrode 191 and the light blocking member protection layer 229 to form a sacrificial layer 300 through a photoprocess. The sacrificial layer 300 may extend in the column direction. The sacrificial layer 300 may be formed at each pixel PX and the first valley V1, and may not be formed at the second valley V2.

Figure 17:
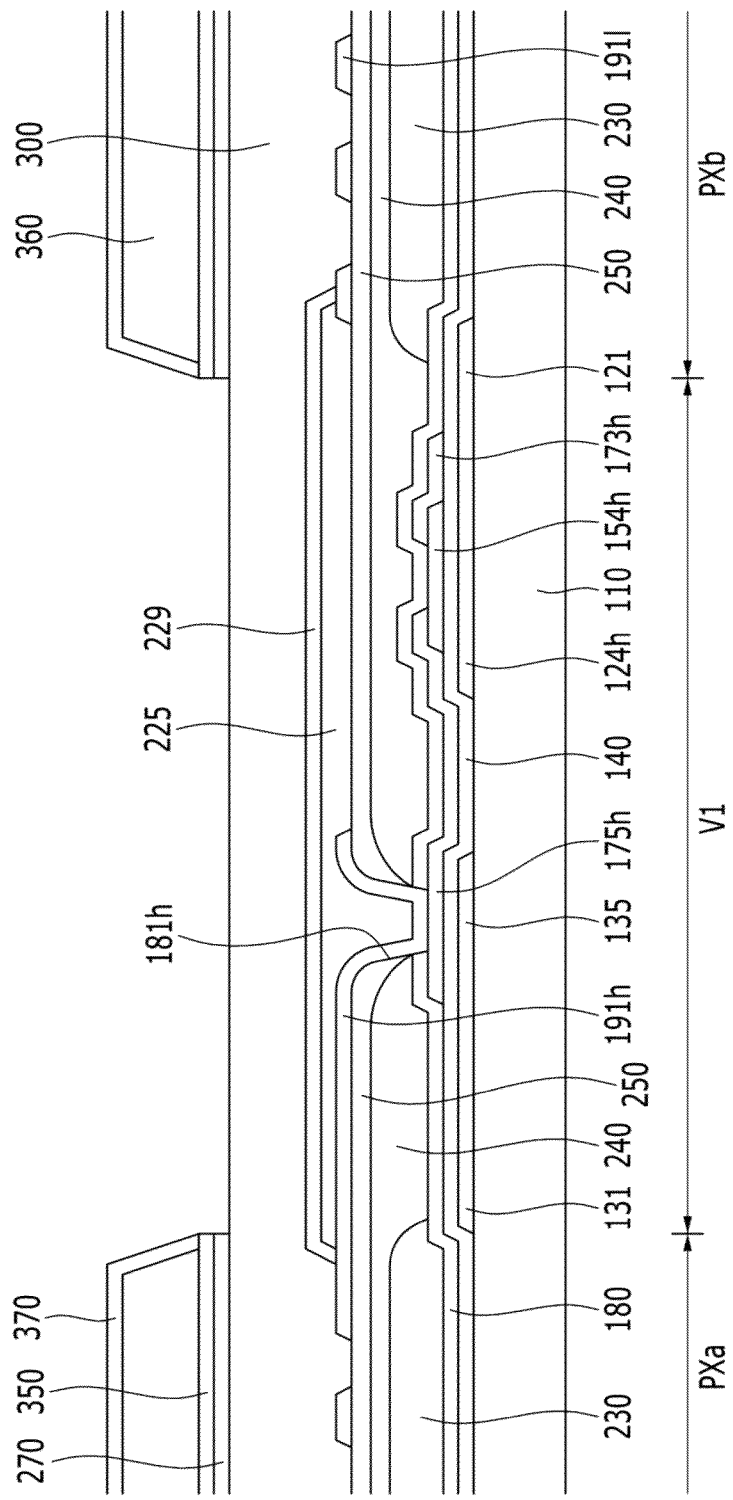
Figure 18:
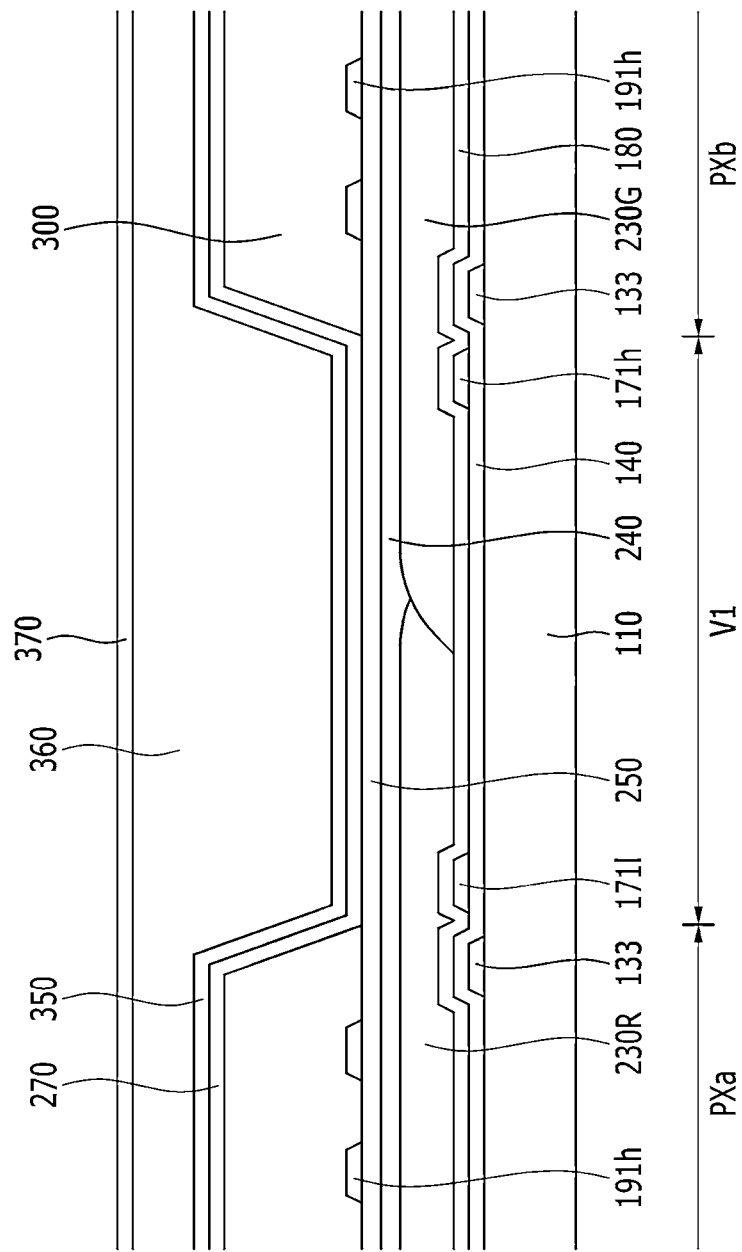

As shown in FIG. 17 and FIG. 18, the transparent metal oxide material such as ITO or IZO is deposited on the sacrificial layer 300 to form a common electrode 270.

Next, a third insulating layer 350 of the inorganic insulating material such as a silicon oxide or a silicon nitride is formed on the common electrode 270.

An organic material is then coated and patterned on the third insulating layer 350 to form a roof layer 360. In this case, the patterning may be performed to remove the organic material disposed at the first valley V1. Accordingly, the roof layer 360 is formed of a shape in which the roof layer 360 extends along a plurality of pixel rows.

The third insulating layer 350 and the common electrode 270 are then patterned by using the roof layer 360 as a mask to remove the third insulating layer 350 and the common electrode 270 disposed at the first valley V1.

The inventive concept is not limited thereto, and the third insulating layer 350 and the common electrode 270 are patterned by a separate mask instead of the roof layer 360. In case using the roof layer as a mask, the number of mask used at the manufacturing process can be reduced.

Next, a fourth insulating layer 370 made of the inorganic insulating material such as a silicon nitride (SiNx) and a silicon oxide a (SiOx) is formed on the roof layer 360. The fourth insulating layer 370 is patterned to remove the fourth insulating layer 370 disposed at the first valley V1. In this case, as shown in the drawing, the fourth insulating layer 370 may be formed to cover the upper surface and the lateral surface of the roof layer 360.

By patterning the roof layer 360, the third insulating layer 350, the common electrode 270, and the fourth insulating layer 370, the sacrificial layer 300 disposed at the first valley V1 is exposed outside.

Figure 19:
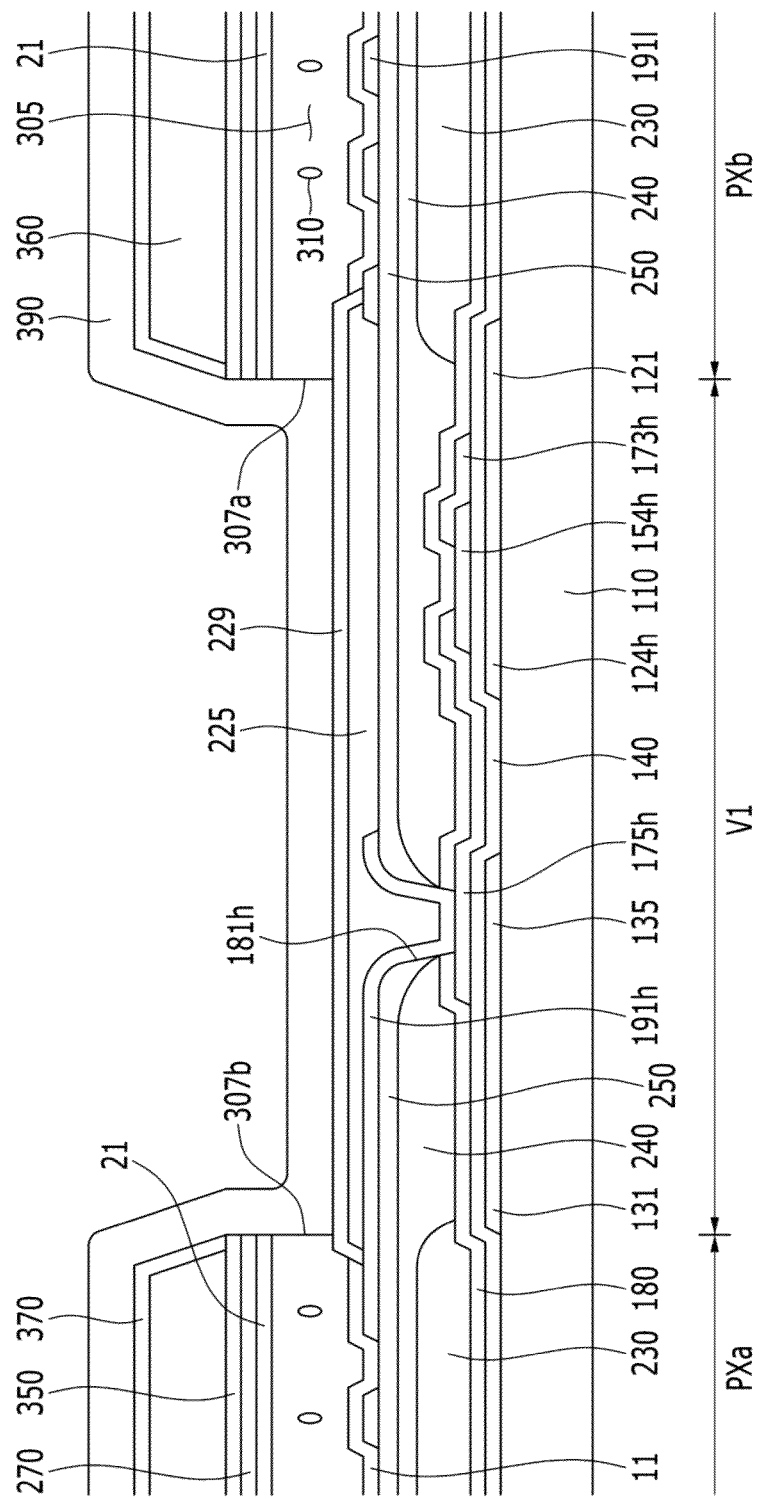
Figure 20:
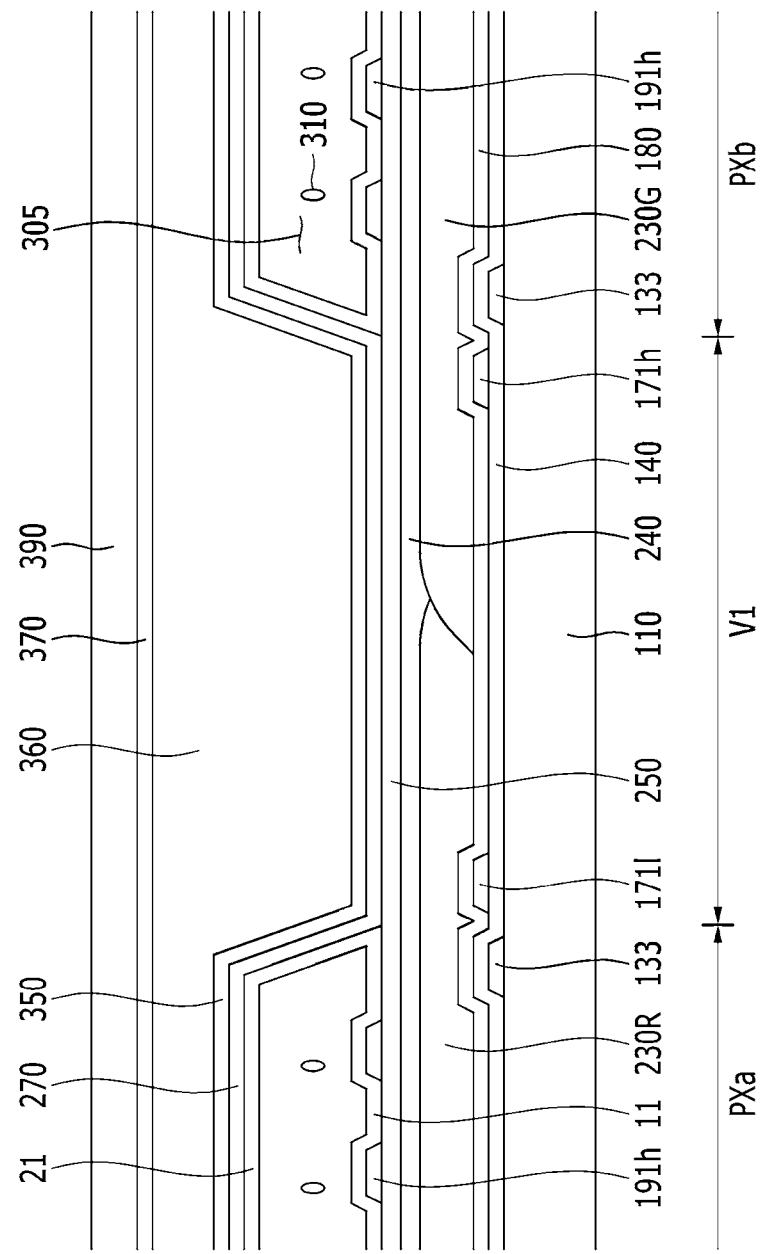

As shown in FIG. 19 and FIG. 20, the sacrificial layer 300 is fully removed by applying a developer or stripper solution on the substrate 110 where the sacrificial layer 300 is exposed, or the sacrificial layer 300 is fully removed by using an ashing process.

When the sacrificial layer 300 is removed, the microcavity 305 is generated at a position where the sacrificial layer 300 is disposed.

The common electrode 270 and the pixel electrode 191 are spaced apart from each other with the microcavity 305 therebetween, and the pixel electrode 191 and the roof layer 360 are spaced apart from each other with the microcavity 305 therebetween. The common electrode 270 and the roof layer 360 are formed to cover the upper portion and both side portions of the microcavity 305.

The inventive concept is not limited thereto, and the common electrode 270 may be formed on or under the insulating layer disposed between the pixel electrode 191 and the common electrode 270. Further, the common electrode 270 and the pixel electrode 191 are disposed at the same layer alternately. Here, the microcavity 305 is not formed between the pixel electrode 191 and the common electrode 270, and the microcavity 305 may be formed on the pixel electrode 191 and the common electrode 270.

The microcavity 305 is exposed to the outside through a portion where the roof layer 360 and the common electrode 270 are removed, which is called injection holes 307a and 307b. Two injection holes 307a and 307b may be formed in one microcavity 305, for example, a first injection hole 307a, through which a lateral surface of a first edge of the microcavity 305 is exposed, and a second injection hole 307b, through which a lateral surface of a second edge of the microcavity 305 is exposed may be formed. The first edge and the second edge are edges facing each other, and for example, the first edge may be the upper edge of the microcavity 305, and the second edge may be the lower edge of the microcavity 305.

Next, an aligning agent containing an alignment material is dripped on the substrate 110 by a spin coating method or an inkjet method. The aligning agent is injected into the microcavity 305 through the injection holes 307a and 307b by a capillary phenomenon. When curing the alignment agent, a solvent is evaporated and the alignment material remains at an inner wall of the microcavity 305.

Accordingly, a first alignment layer 11 may be formed on the pixel electrode 191, and a second alignment layer 21 may be formed below the common electrode 270. The first alignment layer 11 and the second alignment layer 21 may face each other with the microcavity 305 therebetween, and be connected to each other at the side wall of the edge of the microcavity 305.

In this case, the first and second alignment layers 11 and 21 may be aligned in a direction perpendicular to the substrate 110 except at the lateral surface of the microcavity 305.

Subsequently, when a liquid crystal material is dripped on the substrate 110 by an inkjet method or a dispensing method, the liquid crystal material is injected into the microcavity 305 through the injection holes 307a and 307b.

An encapsulation layer 390 is then formed by depositing a material which does not react with the liquid crystal molecules 310 on the fourth insulating layer 370. The encapsulation layer 390 is formed to cover the injection holes 307a and 307b, thereby sealing the microcavity 305 so that the liquid crystal molecules 310 formed in the microcavity 305 are not discharged to the outside.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
    a substrate;
    a thin film transistor disposed on the substrate;
    a pixel electrode connected to the thin film transistor;
    a light blocking member disposed on the pixel electrode to overlap the thin film transistor, the light blocking member being disposed on an opposite side of the thin film transistor with respect to the pixel electrode;
    a common electrode disposed on the pixel electrode to be spaced apart from the pixel electrode with a plurality of microcavities interposed therebetween;
    a roof layer disposed on the common electrode;
    a liquid crystal layer filling the microcavity; and
    an encapsulation layer disposed on the roof layer to seal the microcavity.

2. The display device of claim 1, further comprising a light blocking member protection layer disposed on the light blocking member.

3. The display device of claim 2, wherein the light blocking member protection layer includes a silicon nitride or a silicon oxide.

4. The display device of claim 3, wherein the color filter includes a first color filter and a second color filter, and the first color filter and the second color filter overlap each other at the second valley.

5. The display device of claim 2, wherein the light blocking member directly contacts the pixel electrode.

6. The display device of claim 5, wherein the light blocking member partially overlaps the gate line and the storage electrode.

7. The display device of claim 2, wherein the light blocking member partially overlaps the gate line and the storage electrode.

8. The display device of claim 1, wherein the light blocking member directly contacts the pixel electrode.

9. The display device of claim 8, wherein the light blocking member partially overlaps the gate line and the storage electrode.

10. The display device of claim 1, wherein the light blocking member partially overlaps the gate line and the storage electrode.

11. A method of manufacturing a display device comprising:
   forming a thin film transistor on a substrate;
   forming a pixel electrode connected to the thin film transistor;
   forming a light blocking member on the pixel electrode to overlap the thin film transistor, the light blocking member being disposed on an opposite side of the thin film transistor with respect to the pixel electrode;
   forming a sacrificial layer on the pixel electrode;
   forming a common electrode on the sacrificial layer;
   forming a roof layer on the common electrode;
   patterning the common electrode and the roof layer to expose a portion of the sacrificial layer;
   removing the sacrificial layer to form a microcavity between the pixel electrode and the common electrode;
   injecting a liquid crystal material inside the microcavity to form a liquid crystal layer; and
   forming an encapsulation layer so as to cover a portion where the microcavity is exposed to seal the microcavity.

12. The method of claim 11, further comprising
   forming a light blocking member protection layer on the light blocking member.

13. The method of claim 12, wherein
   the light blocking member protection layer includes a silicon nitride or a silicon oxide.

14. The method of claim 13, wherein
   the color filter includes a first color filter and a second color filter, and
   the first color filter and the second color filter overlap each other at the second valley.

15. The display device of claim 12, wherein the light blocking member directly contacts the pixel electrode.

16. The display device of claim 15, wherein the light blocking member partially overlaps the gate line and the storage electrode.

17. The display device of claim 12, wherein the light blocking member partially overlaps the gate line and the storage electrode.

18. The display device of claim 11, wherein the light blocking member directly contacts the pixel electrode.

19. The display device of claim 18, wherein the light blocking member partially overlaps the gate line and the storage electrode.

20. The display device of claim 11, wherein the light blocking member partially overlaps the gate line and the storage electrode.

* * * * *